United States Patent
Butler et al.

(10) Patent No.: US 6,487,328 B2
(45) Date of Patent: Nov. 26, 2002

(54) SINGLE WAVELENGTH SEMICONDUCTOR LASER WITH GRATING-ASSISTED DIELECTRIC WAVEGUIDE COUPLER

(75) Inventors: Jerome K. Butler, Richardson; Lily Y. Pang, McKinney; Gary A. Evans, Plano, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/823,019

(22) Filed: Mar. 30, 2001

(65) Prior Publication Data

US 2001/0012423 A1 Aug. 9, 2001

Related U.S. Application Data

(63) Continuation of application No. 09/211,745, filed on Dec. 15, 1998.
(60) Provisional application No. 60/069,489, filed on Dec. 15, 1997.

(51) Int. Cl.⁷ .................................................. G02B 6/12
(52) U.S. Cl. .............................. 385/14; 385/15; 385/37; 385/31; 385/50; 372/50; 372/43; 372/102
(58) Field of Search .............................. 385/14, 15, 31, 385/37, 49, 50; 372/50, 96, 102, 106, 45, 43, 48

(56) References Cited

U.S. PATENT DOCUMENTS

| 4,097,118 A | 6/1978 | Hammer .................. 350/96.17 |
| 4,286,232 A | 8/1981 | Puech et al. ........... 331/94.5 H |
| 4,318,058 A | 3/1982 | Mito et al. ..................... 372/50 |
| 4,737,007 A | 4/1988 | Alferness et al. ........ 350/96.19 |
| 4,896,325 A * | 1/1990 | Coldren ....................... 372/102 |
| 5,020,153 A * | 5/1991 | Choa et al. ................... 372/96 |
| 5,070,488 A | 12/1991 | Fukushima et al. ...... 360/44.12 |
| 5,123,070 A | 6/1992 | Bradley ....................... 385/37 |
| 5,131,060 A | 7/1992 | Sakata ........................... 385/2 |
| 5,172,391 A * | 12/1992 | Zayhowski ................. 372/106 |
| 5,220,573 A | 6/1993 | Sakata et al. ................. 372/50 |
| 5,233,187 A | 8/1993 | Sakata et al. .......... 250/227.24 |
| 5,252,839 A | 10/1993 | Fouquet ....................... 257/95 |
| 5,285,508 A | 2/1994 | Chikuma ..................... 385/30 |
| 5,410,622 A | 4/1995 | Okada et al. ................. 385/14 |
| 5,517,589 A | 5/1996 | Takeuchi ..................... 385/24 |
| 5,528,616 A | 6/1996 | Kask et al. ................... 372/45 |
| 5,673,284 A | 9/1997 | Congdon et al. ............. 372/50 |
| 6,064,783 A | 5/2000 | Congdon et al. ............. 385/15 |
| 6,236,773 B1 * | 5/2001 | Butler et al. ................. 385/14 |

FOREIGN PATENT DOCUMENTS

| GB | 1535171 | 12/1978 |
| JP | 3-263010 A | 11/1991 |
| JP | 4-287389 | 10/1992 |

* cited by examiner

Primary Examiner—Frank G. Font
Assistant Examiner—Sang H. Nguyen
(74) Attorney, Agent, or Firm—David Denker; Wade James Brady, III; Frederick J. Telecky, Jr.

(57) ABSTRACT

A grating (18) couples the waveguide region (36) of a semiconductor laser (11) to a dielectric waveguide (26). The waveguide region of the laser includes a mirror (15) at one end thereof and an absorber (19) at the other end thereof. The dielectric waveguide includes a reflector (24) therein to reflect a portion of the light coupled from the laser to the dielectric waveguide back into the laser waveguide region.

18 Claims, 2 Drawing Sheets

SINGLE WAVELENGTH SEMICONDUCTOR LASER WITH GRATING-ASSISTED DIELECTRIC WAVEGUIDE COUPLER

This application is a continuation of application Ser. No. 09/211,745, filed Dec. 15, 1998; which claims priority from Provisional Appl. No. 60/069,489, filed Dec. 15, 1997.

BACKGROUND OF THE INVENTION

1. Field of the Invention

This invention relates to a single wavelength laser with grating-assisted dielectric waveguide coupler.

2. Brief Description of the Prior Art

Optical communication systems typically employ semiconductor laser sources and glass optical fiber communication channels. There are many configurations of semiconductor lasers including various material compositions and various dimensions of the grown layers that form the active region and an associated optical waveguide in the laser structure. The material composition of the active region determines the wavelength of operation. For example, at lasing wavelengths of about 0.9 $\mu$m, the group III–V materials of the ternary compound $Al_xGa_{(1-x)}As$ with GaAs quantum wells provide a compact and rugged source of infrared light which can be easily modulated by varying the diode current. Communications systems of this type are discussed in Ser. No. 08/248,937, now issued as U.S. Pat. No. 6,064,783, the contents of which are incorporated herein by reference. Light from a laser can be extracted by abutting an optical fiber thereto in known manner, however, devices fabricated in this manner do not lend themselves to semiconductor fabrication. Lasers can be abutted to optical fibers, however the indices of refraction between optical fibers and semiconductor material are so dissimilar that the amount of coupling is very low, leading to an inefficient device. Furthermore, the alignment of the source with an optical fiber is quite tedious when high coupling efficiency is desired. This mismatch of the light field of the laser and that of the optical fiber also affects the amount of light coupled to the fiber.

In the device described in the above noted application, the direct coupling of the semiconductor laser output into an optical fiber was improved over the prior art by providing a semiconductor laser integrated with a silicon dioxide based waveguide having high efficiency coupling of the laser output into the waveguide by an integrated grating to permit the laser output to be coupled into an optical fiber by butt coupling of the optical fiber to the silicon dioxide based waveguide. The grating, when appropriately designed as discussed in the above noted application, provides a matching of the propagation in the laser with the propagation in the glass. The period of the grating determines the wavelength of that portion of the light in the laser waveguide that will be passed through the grating to the optical fiber. Multiple lasers with different wavelengths could be integrated and their outputs coupled and combined into a single waveguide for wavelength division multiplexed operation. A problem with the device of the above-mentioned application is that the narrow bandwidth of grating assisted directional couplers makes it difficult to match them with an integrated single wavelength laser source whose lasing wavelength must lie within the bandwidth of the coupler. The architecture of grating assisted directional couplers typically consists of two waveguides and an optical grating whose period is dictated by the geometry of the two waveguides. The geometrical properties include the waveguide dimensions as well as the refractive index profiles. Generally, the lasing wavelength is governed by an optical grating that produces the necessary feedback to the laser. Precise machining of both gratings must be made to allow for satisfactory operation.

SUMMARY OF THE INVENTION

The above noted problems of the prior art are minimized in accordance with the present invention.

Briefly, there is provided a semiconductor laser, preferably of the type set forth in the above noted copending application, coupled on one side of the anode/cathode structure of the laser to a dielectric waveguide via a grating as in the above noted application. The semiconductor laser is formed from either group III–V compound materials or from group II–VI compound materials (the material system determines the wavelength of operation), and preferably includes various hetero-junctions and thin layers that form quantum well regions. Generally, there are two hetero-junctions that form the boundary between a central, high refractive index (relative to the central region). The light generated from the active region (generally part of the central region) is then confined by the high refractive index layer (central region). The coupling grating is formed at the interface of the laser cladding layer and the cladding layer of the dielectric waveguide. The dielectric waveguide is formed from silicon dioxide based materials and preferably phosphosilicate glass which is deployed p-type having from about 8 to about 10 percent by weight of dopant. The dielectric waveguide is preferably phosphosilicate glass with the dopant being phosphorous. The dielectric waveguide includes a reflector, such as, for example, a mirror at an end region formed by high reflection coating the dielectric waveguide facet thereof to reflect a portion of the light therein back through the grating and into the laser to provide the required feedback of the desired light frequency as determined by the grating while all other frequencies which are not passed through the grating are absorbed by the absorber and are not reflected back into the laser active region. The light fed back through the grating will be at the same wavelength as the light initially transmitted through the grating. It follows that the grating is performing the function of both reflection and wavelength selection. In this manner, the desired lasing wavelength is enhanced by the light being fed back whereas all other light wavelengths are rejected or minimized by being absorbed by the absorber.

In operation, broad band light (stimulated emission) is generated in the laser active region. The generated light from the active region propagates to both the front (right direction) and to the rear (left direction). Light traveling in the left (backward direction) is reflected by a broad band reflector (mirror) that may be located at either the edge of the active region or at a distance from the edge. The backward propagating light beam is reflected back into the active region and produces the total beam that is propagating to the right (forward direction). In the absence of the grating coupler, the light traveling out of the front of the active region continues in the semiconductor waveguide section and enters into an absorbing region. As a result, light is not fed back into the active region and, accordingly, the stimulated emission spectrum will not become narrow (i.e., non lasing condition). In the presence of the grating and an auxiliary waveguide that is parallel to the semiconductor waveguide (co-planar geometry), the broad band light within the laser waveguide is coupled (and filtered) to the auxiliary waveguide. The filtered-out wavelength coupled to the auxiliary waveguide is determined by the grating period, grating depth, relative location, and the geometrical and dielectric characteristics of both the semiconductor and auxiliary waveguide. A reflector, which is formed by a high reflection coating on the dielectric facet in the auxiliary waveguide, such as, for example, a mirror, is provided to reflect a portion of the light in the auxiliary waveguide back into the semiconductor waveguide. Since the light reflected by the mirror in the auxiliary waveguide has the specific wavelength (or narrow-band spectrum that was initially filtered by the grating), the light will naturally couple back to the semiconductor waveguide and, accordingly, be fed back into the laser active region. The result is that the stimulated emission within the laser is enhanced only at the wavelength transmitted through and fed back by the grating. All other wavelengths generated from the active region of the laser are absorbed by the absorber at the terminal region of the laser. p While only a single laser is discussed herein, it should be understood that the device in accordance with the present invention can replace one or all of the devices 410, 420, 430 or 440 in FIG. 4*a* of the above noted application with the grating in each device being adjusted to the desired wavelength.

DESCRIPTION OF THE PREFERRED EMBODIMENT

Figure 1:
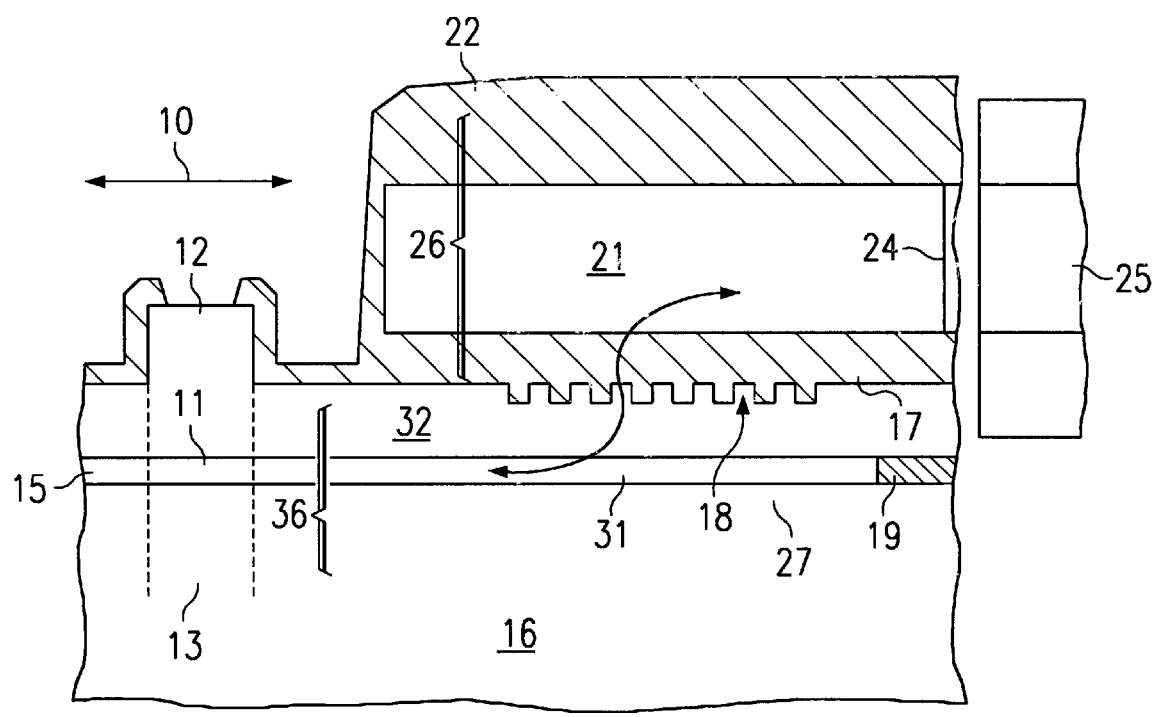
FIG. 1 of the drawing is a cross-section through the laser, grating and waveguide in accordance with the present invention.

Referring to the FIGURE, there is shown a laser 10 having an active region location 11 and the associated laser waveguide core region 31 beyond the region under the anode (active layer region). The P-type anode 12 and the N-type cathode 13 are disposed on opposing sides of the active region. The laser 10 is disposed on the semiconductor substrate 16. The laser includes a reflector 15 in the form preferably of a mirror on the back side of the laser waveguide/cladding layers. Electrical current flowing through the diode causes electron/hole recombination in the active area (holed from anode 12 and electrons from the cathode 13) which releases energy at photons. Outside of the active area 11 the laser waveguide core 31 and cladding 27, 32 extend from the active region. An absorber 19 is disposed in the laser waveguide core layers beyond the grating 18. The semiconductor waveguide 36 confines generated photons in the active region to the high index of refraction region of the laser waveguide core 31.

A coupling grating 18 is disposed adjacent the anode 12 and on the side thereof remote from the mirror 15. The silicon dioxide layer 17 extends over the grating 18. Light having a wavelength as determined by the period of the grating 18 is passed through the grating 18 to the phosphosilicate glass core 21. PSG core 21 is doped with 8 percent by weight phosphorous and has an index of refraction of 1.46. PSG core 21 has a cladding thereover of silicon dioxide 22. $SiO_2$ layer 17, glass core 21, and cladding 22 cooperate to form dielectric waveguide 26. The light passes along the glass core 21 with some of the light passing through to a standard core 25 for external transmission and a portion of the light striking the mirror 24 and being reflected therefrom back through the core 21 and the axial region containing the layer 18 to provide the feedback to the laser. The light which is not passed through the grating 18 is absorbed by the absorber 19. Mirror 24 is formed by high reflection coating of the waveguide 21 facet. Mirror 15 is formed by high reflection coating the laser waveguide facet.

Figure 2:
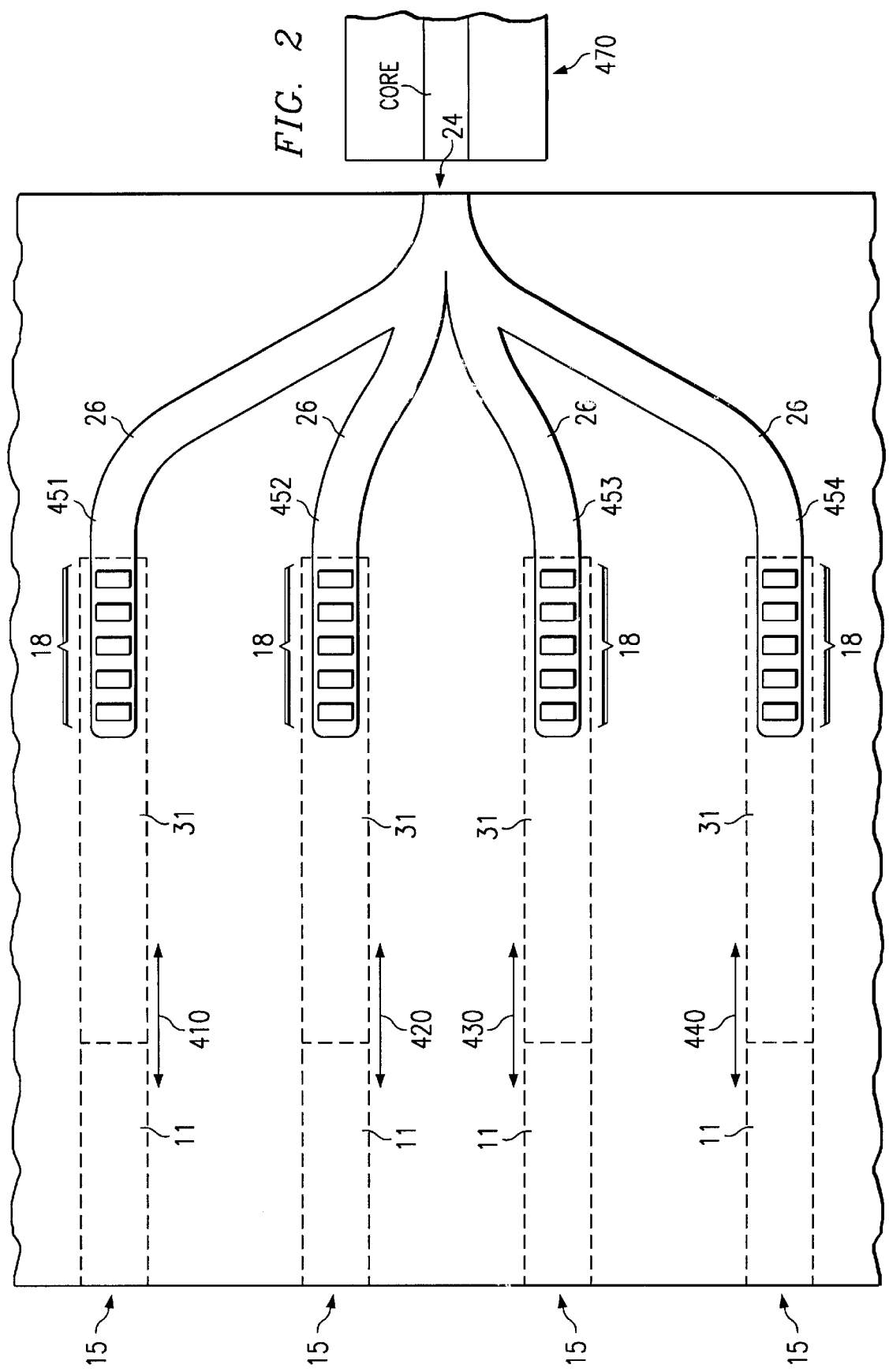
FIG. 2 shows a simplified plan view of a multiple laser embodiment in accordance with the present invention.

The example above shows only a single laser. FIG. 2 shows how multiple lasers 410, 420, 430, and 440 can be integrated and their outputs coupled and combined into a single waveguide 26 having branches 451, 452, 453, and 454. Typically, the lasers will have different wavelengths to allow wavelength division multiplexed operation. For clarity, external waveguide 470 is shown slightly separated from mirror 24.

Though the invention has been described with reference to a specific preferred embodiment thereof, many variations and modifications will immediately become apparent to those skilled in the art. It is therefore the intention that the appended claims be interpreted as broadly as possible in view of the prior art to include all such variations and modifications.

What is claimed is:

1. A method of emitting monochromatic light from an integrated circuit, the method comprising generating light in an active region of a semiconductor laser, the laser having a semiconductor waveguide;

transmitting the light through the semiconductor waveguide;

further transmitting a portion of the light having a first wavelength through a monochromatic grating and into an adjacent dielectric waveguide;

reflecting a first part of the light having the first wavelength
back through the monochromatic grating,
into the semiconductor waveguide, and
into the active region of the semiconductor laser; and transmitting a second part of the light having the first wavelength through an external interface of the dielectric waveguide.

2. The method of claim 1, further comprising allowing the generated and reflected light to travel to a region of the semiconductor waveguide remote from the monochromatic grating, and reflecting a substantial portion of the generated and reflected light back through the semiconductor waveguide toward the monochromatic grating.

3. The method of claim 1, further comprising transmitting the second part of the light having the first wavelength through an optical fiber.

4. The method of claim 1, further comprising generating a second light in a second active region of a second semiconductor laser, the second laser having a second semiconductor waveguide;

transmitting the second light through the second semiconductor waveguide;

further transmitting a portion of the second light having a second wavelength through a second monochromatic grating and into an adjacent second dielectric waveguide;

reflecting a first part of the light having the second wavelength
back through the second monochromatic grating,
into the second semiconductor waveguide, and
into the second active region of the second semiconductor laser; and transmitting a second part of the light having the second wavelength through an external interface of the second dielectric waveguide.

5. The method of claim 4, wherein the dielectric waveguide and the second dielectric waveguide are portions of a combined dielectric waveguide.

6. The method of claim 4, wherein the dielectric waveguide and the second dielectric waveguide are portions of a combined dielectric waveguide, and the external interface of the dielectric waveguide and the external interface of the second dielectric waveguide are shared as a combined external interface of the combined dielectric waveguide.

7. The method of claim 6, further comprising transmitting the second part of the light having the first wavelength and the second part of the light having the second wavelength through an optical fiber.

8. A microelectronic circuit comprising:

a semiconductor laser;

a dielectric waveguide coupled to the semiconductor laser by a grating;

the dielectric waveguide having an external transmission interface; and a partial reflector in the dielectric waveguide to feed back light from the dielectric waveguide to the semiconductor laser;

the partial reflector disposed near the external transmission interface.

9. The circuit of claim 8 wherein the semiconductor laser includes an active region and a waveguide region, the waveguide region further including an absorber therein.

10. The circuit of claim 9 wherein the absorber is disposed at one end region of the waveguide region, further including a reflector disposed at a region of the waveguide region remote from the absorber.

11. The circuit of claim 10, further comprising an external waveguide coupled to the external transmission interface.

12. The circuit of claim 8, further comprising an external waveguide coupled to the external transmission interface.

13. The circuit of claim 8, wherein the semiconductor laser includes a waveguide region, wherein the dielectric waveguide is coupled to the semiconductor laser in the waveguide region of the semiconductor laser, wherein the waveguide region of the semiconductor laser does not include a reflector disposed proximate the coupling.

14. The circuit of claim 8, further comprising a second semiconductor laser;

a second dielectric waveguide coupled to the second semiconductor laser by a second grating, the second dielectric waveguide having an external transmission interface; and a partial reflector in the second dielectric waveguide to feed back light from the second dielectric waveguide to the second semiconductor laser;

the partial reflector disposed near the external transmission interface of the second dielectric waveguide.

15. The method of claim 14, wherein the dielectric waveguide and the second dielectric waveguide are portions of a combined dielectric waveguide.

16. The method of claim 14, wherein the dielectric waveguide and the second dielectric waveguide are portions of a combined dielectric waveguide, and the external transmission interface of the dielectric waveguide and the external transmission interface of the second dielectric waveguide are shared as a combined external transmission interface of the combined dielectric waveguide.

17. The method of claim 16, wherein the grating is operable to pass a different wavelength of light than the second grating.

18. The method of claim 14, wherein the grating is operable to pass a different wavelength of light than the second grating.

* * * * *